United States Patent
Chen et al.

(10) Patent No.: US 8,451,028 B2
(45) Date of Patent: May 28, 2013

(54) METHODS AND DEVICES FOR DETECTING SINGLE-EVENT TRANSIENTS

(75) Inventors: Li Chen, Saskatoon (CA); Zhichao Zhang, Saskatoon (CA); Tao Wang, Saskatoon (CA)

(73) Assignee: University of Saskatchewan, Saskatoon, SK (CA)

( * ) Notice: Subject to any disclaimer, the term of this patent is extended or adjusted under 35 U.S.C. 154(b) by 0 days.

(21) Appl. No.: 13/069,102

(22) Filed: Mar. 22, 2011

(65) Prior Publication Data

US 2012/0242373 A1 Sep. 27, 2012

(51) Int. Cl.
*H03K 5/153* (2006.01)

(52) U.S. Cl.
USPC .......................................... 327/78; 327/199

(58) Field of Classification Search
USPC ............... 327/51–53, 56, 57, 77, 78, 80, 81, 327/199, 208–210
See application file for complete search history.

(56) References Cited

U.S. PATENT DOCUMENTS

| | | | | |
|---|---|---|---|---|
| 6,236,259 | B1 * | 5/2001 | Goodell et al. | 327/534 |
| 6,483,353 | B2 * | 11/2002 | Kim et al. | 327/55 |
| 6,828,763 | B2 * | 12/2004 | Sudou et al. | 323/226 |
| 2011/0248759 | A1 * | 10/2011 | Chi et al. | 327/202 |

FOREIGN PATENT DOCUMENTS

| | | |
|---|---|---|
| CN | 101551421 A | 10/2009 |
| WO | 2010113059 A1 | 10/2010 |

OTHER PUBLICATIONS

R. Ecoffet, S. Duzellier, P. Tastet., C. Aicardi., M. Labrunee, "Observation of Heavy Ion Induced Transients in Linear Circuits," IEEE Radiation Effects Data Workshop, pp. 72-77, Jul. 1994.

Sedra et al., "Chapter 3—Current Conveyor Theory and Practice", Advances in Analog Integrated Circuit Design, C. Toumazou, F.J. Lidgey and D.G. Haigh (Editors), Peter Peregrinus Limited, London, England, pp. 93-126, 1990.

T. Roy, A. F. Witulski, et al., "Single Event Mechanisms in 90 nm Triple-Well CMOS Devices", IEEE Trans. Nucl. Sci., vol. 55, No. 6, pp. 2948-2956, Dec. 2008.

R. Harboe-Sørensen, F. X. Guerre, H. Constans, J. Van Dooren, G.Berger, W. Hajdas, "Single Event Transient Characterization of Analog IC's For ESA's Satellites," in Proc. RADECS, pp. 573-581, Sep. 1999.

B. E. Pritchard, G. M. Swift, A. H. Johnston, "Radiation Effects Predicted, Observed, and Compared for Spacecraft Systems," in Proc. IEEE NSREC Radiation Effects Data Workshop Record, pp. 7-13, 2002.

V. Pouget, H. Lapuyade, D. Lewis, Y. Deval, P. Foulliat, L. Sarger, "SPICE Modeling of the Transient Response of Irradiated MOSFETs," IEEE Transactions on Nuclear Science, vol. 47, No. 3, pp. 508-513, Jun. 2000.

Y. Boulghassoul, L. W. Massengill, A. L. Sternberg, B. L. Bhuva, "Effects of Technology Scaling on the SET Sensitivity of RF CMOS Voltage-Controlled Oscillators," IEEE Transactions on Nuclear Science, vol. 52, No. 6, pp. 2426-2432, Dec. 2005.

(Continued)

*Primary Examiner* — Lincoln Donovan
*Assistant Examiner* — Sibin Chen
(74) *Attorney, Agent, or Firm* — Duane Morris LLP

(57) ABSTRACT

Methods and devices for detecting single-event transients in combinational logic circuits and other circuits. A sensing circuit detects a voltage or current deviation at a bulk contact node of a transistor. Output of the sensing circuit is amplified and used to flip a latch. Output of the latch may be evaluated and used in possible error correction measures.

19 Claims, 12 Drawing Sheets

OTHER PUBLICATIONS

T. D. Loveless, L. W. Messengill, B. L. Bhuva, W. T. Holman, A. F. Witulski, Y. Boulghassoul, "A Hardened-by-Design Technique for RF Digital Phase-Locked Loops," IEEE Transactions on Nuclear Science, vol. 53, pp. 3432-3438, Dec. 2006.

E. Mikkola, B. Vermeire, H. J. Barnaby, H. G. Parks, K. Borhani, "SET tolerant CMOS Comparator," IEEE Transactions on Nuclear Science, vol. 51, No. 6, pp. 3609-3614, Dec. 2004.

P. Shivakumar et al., "Modeling the Effect of Technology Trends on the Soft Error Rate of Combinational Logic". Int'l Conf. Dependable Systems and Networks (DSN 02), IEEE CS Press, pp. 389-398, 2002.

F. Leite, T. Balen, M. Nerve, M. Lubaszewskil, G. Wirth, "Using Bulk Built-In Current Sensors and Recomputing Techniques to Mitigate Transient Faults in Microprocessors," Test Workshop, pp. 1-6, Mar. 2009.

F. Vargas, M. Nicolaidis, "SEU-tolerant SRAM Design Based on Current Monitoring," Fault-Tolerant Computing, FTCS-24, pp. 106-115, 1994.

E. H. Neto, I. Ribeiro, M.Vieira, G. Wirth. "Using Bulk Built-In Current Sensors to Detect Soft Errors," IEEE Micro, vol. 26, pp. 10-18, Sep.-Oct. 2006.

G. Wirth, C. Fayomi, "The Bulk Built In Current Sensor Approach for Single Event Transient Detection," International Symposium on System-on-Chip, pp. 1-4, Nov. 20-21, 2007.

Z. Zhang. T. Wang, L. Chen, A. Dinh, and J. Yang, "A New Bulk Built-In Current Sensing Circuit for Single-Event Transient Detection," IEEE Canadian Conference on Electrical and Computer Engineering, May 2010, 4 pages.

P.E. Dodd and L.W. Massengill, "Basic Mechanisms and Modeling of Single-Event Upset in Digital Microelectronics", IEEE Trans. Nuclear Science, vol. 50, No. 3, pp. 583-602, Jun. 2003.

M. J. Gadlage, et al., "Single Event Transient Pulsewidths in Digital Microcircuits", IEEE Trans. Nucl. Sci., vol. 51, No. 6, pp. 3285-3290, Dec. 2004.

T. Wang, et al., "Single-Event Transients Effects on Dynamic Comparators in a 90 nm CMOS Triple-Well and Dual-Well Technology", IEEE Trans. Nucl. Sci., 2009, 56(6):3556-3560 (also published in IEEE Nuclear and Space Radiation Effect Conference (NSREC), Quebec City, Quebec, Jul. 20-24, 2009).

T. Wang, Z. Zhang, L. Chen, A.V. Dinh, R. Shuler, "A Novel Bulk Built-In Current Sensor for Single-Event Transient Detection", Silicon Errors in Logic—System Effects (SELSE) Workshop, Mar. 23-24, 2010, pp. 1-4.

Z. Zhang, N. J. Gaspard, T. Wang, Y. Ren, L. Chen, A. F. Witulski, W. T. Holman, B. L. Bhuva, S.-J. Wen, and R. Sammynaiken, "A Bulk Built-In Voltage Sensor to Detect Physical Location of Single-Event Transients", IEEE Nuclear & Space Radiation Effects Conference, Las Vegas, Nevada, Jul. 25-29, 2011, 5 pages.

* cited by examiner

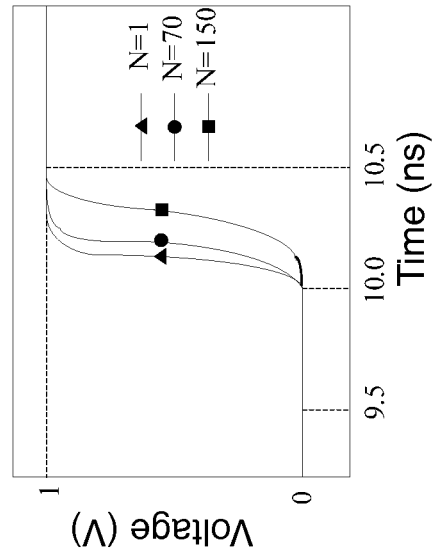
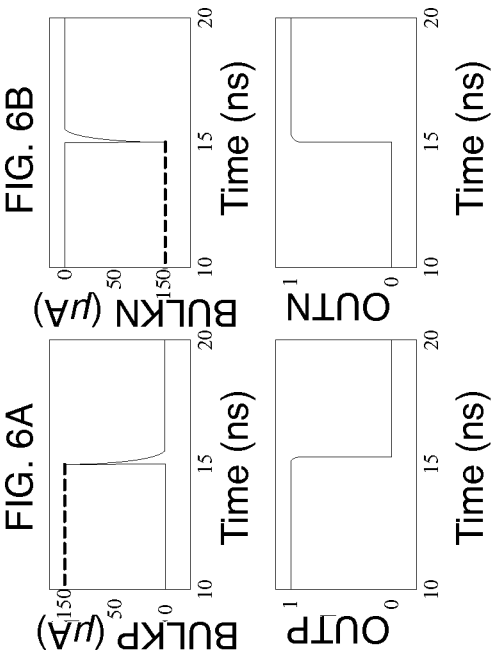

METHODS AND DEVICES FOR DETECTING SINGLE-EVENT TRANSIENTS

FIELD

The described embodiments relate to fault detection in integrated circuits and, in particular, to detection of single-event transients such as those induced by cosmic rays.

BACKGROUND

With the ever-decreasing geometries in modern integrated circuits (ICs), the amount of charge used to represent a logic state has decreased to a level where single-events can now be a major reliability issue.

A single-event transient (SET) typically occurs when stray, high-energy particles or radiation (e.g., cosmic rays, protons, heavy ions, etc.) strike a sensitive node of a device, such as an integrated circuit. The strike may induce electron-hole pairs in the integrated circuit, which may in turn cause current spikes resulting in a SET in the integrated circuit.

Depending on the location of the strike, the SET may directly or indirectly result in faults that impair the normal operation of the integrated circuit. For example, in a combinational logic circuit, a SET occurring at an internal node of the circuit may cause a logic node to change state, possibly resulting in an incorrect output of the logic circuit.

Accordingly, faults occurring as a result of SET may result in significant errors at circuit output nodes and thus lead to system failures. Such failures can be especially severe in critical computational systems, such as in aerospace applications. Increased exposure to radiation, which is common in aerospace applications, only serves to compound this problem due to the increased prevalence of SETs from the radiation.

Soft error rates in ICs, including errors caused by SETs, are predicted to increase significantly if current technology scaling trends continue. Dual- or triple-redundancy hardening techniques are the most common approaches to mitigate SET pulses in combinational logic circuits. However, the area and power overhead required for such approaches can be too high for many applications.

SUMMARY

In a broad aspect, there is provided a sensor for detecting a single-event transient (SET) in an integrated circuit comprising at least one transistor. The sensor can comprise a sensing circuit, the sensing circuit connected between a bulk rail of the integrated circuit and a bulk contact of the at least one transistor such that in operation a bulk contact voltage is supplied by the bulk rail, the sensing circuit configured to provide a sensing output when a change in operating condition is detected; and a latch, the latch configured to flip from a first state to a second state based on the sensing output.

In some cases, the change in operating condition may be a deviation in the bulk contact voltage from a bulk rail voltage beyond a threshold level. The sensing circuit may comprise at least one sensing transistor, the bulk contact may be connected to a gate of the at least one sensing transistor, and the source of the at least one sensing transistor may be connected to the bulk rail.

In some cases, the change in operating condition may be an increase in a bulk current. The sensor may further comprise a current-to-voltage converter connected to the sensing circuit, the current-to-voltage converter for generating a voltage output based on the increase in the bulk current. The current-to-voltage converter may be a current conveyor.

The sensor may also comprise at least one amplification stage for amplifying the voltage output of the current-to-voltage converter, wherein an amplified output of the at least one amplification stage, corresponding to the voltage output of the current-to-voltage converter, is input to the latch.

In some cases, the at least one transistor is one or more PMOS transistors and the bulk rail voltage may be a supply voltage. In other cases, the at least one transistor is one or more NMOS transistors and the bulk rail voltage may be a neutral voltage.

In some cases, the at least one amplification stage may comprise a differential amplifier or a common-source amplifier. The at least one amplification stage may also comprise a first stage and a second stage. The first stage may be a differential amplifier and the second stage may be a common-source amplifier.

In some cases, the latch may be configured to be reset to the first state by a reset signal.

In some cases, the integrated circuit may be a CMOS circuit.

In another broad aspect, there is provided a method of detecting a single-event transient (SET) in an integrated circuit comprising at least one transistor. The method may comprise connecting a bulk rail of the integrated circuit and a bulk contact of the at least one transistor via a sensing circuit, such that in operation a bulk contact voltage is supplied by the bulk rail; monitoring a bulk contact using the sensing circuit to detect a change in operating condition; and providing a sensing output based on the change in operating condition.

In some cases, the change in operating condition may be a deviation in the bulk contact voltage from a bulk rail voltage beyond a threshold level. In some cases, the change in operating condition may be an increase in a bulk current.

In yet another broad aspect, there is provided a CMOS integrated circuit comprising a single-event transient (SET) detector. The circuit may comprise a plurality of PMOS and NMOS transistors; at least one SET sensor, each SET sensor connected to a subset of PMOS transistors or a subset of NMOS transistors in the plurality of PMOS and NMOS transistors, each SET sensor comprising: a sensing circuit, the sensing circuit connected between a bulk rail of the integrated circuit and a corresponding bulk contact of the at least one transistor such that in operation a bulk contact voltage is supplied by the bulk rail, the sensing circuit configured detect a change in operating condition and provide a sensing output; a latch, the latch configured to flip from a first state to a second state based on the sensing output; and a detection module, the detection module adapted to monitor the latch of each of the SET sensors and trigger error correction if at least one latch of the SET sensors is set to the second state.

BRIEF DESCRIPTION OF THE DRAWINGS

For a better understanding of embodiments of the methods and devices described herein, and to show more clearly how they may be carried into effect, reference will be made, by way of example, to the accompanying drawings in which:

FIGS. 6A to 6E illustrate simulation results for exemplary BIVS circuits;

Figure 1:
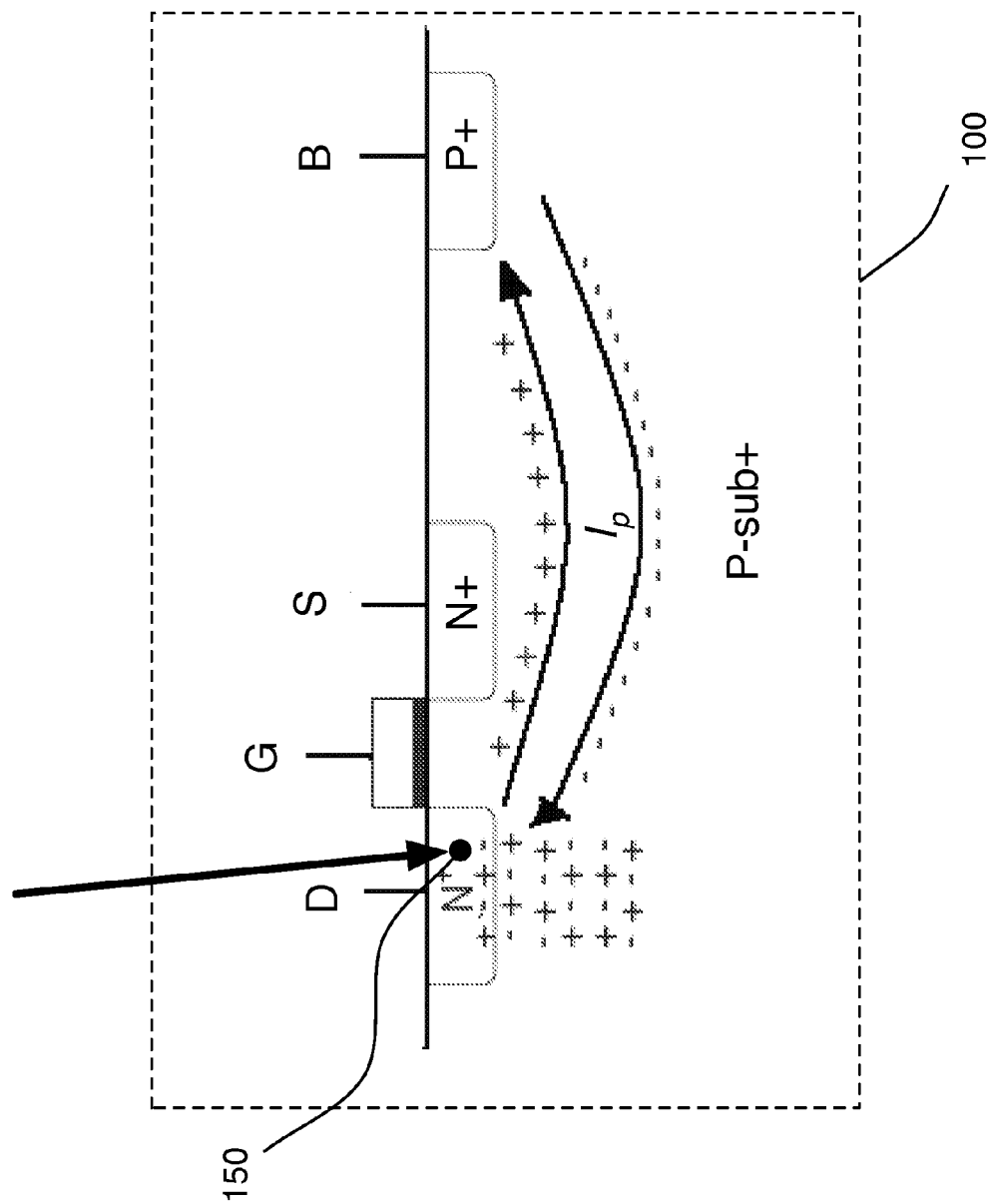
FIG. 1 is a simplified cross-sectional diagram of a stray particle striking a metal-oxide semiconductor field-effect transistor (MOSFET)

The skilled person in the art will understand that the drawings, described below, are for illustration purposes only. The drawings are not intended to limit the scope of the applicants' teachings in any way. Further, where considered appropriate, reference numerals may be repeated among the figures to indicate corresponding or analogous elements.

DESCRIPTION OF EXEMPLARY EMBODIMENTS

With soft errors becoming a major reliability issue, the detection of the temporal and spatial characteristics of stray particles (or radiation) in a logic circuit is becoming increasingly important when developing mitigation strategies for use, for example, in sequential circuits. Stray particles may strike an IC at random times and at random locations. As a result, it can be very difficult to estimate the exact time and location of the particle strike, not least because the transients generated by these strikes can be extremely short (e.g., on the order of tens of picoseconds).

Specialized current sensors have been proposed to monitor power-rail currents in memory ICs, to detect current anomalies caused by single-events. However, a power-rail monitoring approach is not broadly applicable to all classes of circuits. For example, in a combinational logic circuit, a sensor connected to the power rails of an IC may not be capable of effectively differentiating between normal gate switching and switching resulting from a SET event.

Described herein are built-in voltage sensors (BIVS) and built-in current sensors (BICS) capable of detecting SET events in combinational logic circuits and various other circuits. Detection of SET events can facilitate mitigation and correction of errors resulting from the SET events. For example, if a SET is detected in a particular unit of a microprocessor, the result of a computation executed by that unit at the time the SET occurred can be discarded and the computation re-executed.

In particular, the described BIVS and BICS circuits are adapted to monitor the bulk (well) contacts of their respective integrated circuits for changes in operating conditions (e.g., voltage or current). In many classes of integrated circuits, such as complementary metal oxide semiconductor (CMOS) devices, bulk current is negligible during normal operation and bulk voltage is stable. Thus, the extraneous current (and corresponding voltage deviation) induced by a stray particle strike can be detected with relative ease.

Although the described sensing approaches are described herein with particular reference to CMOS devices, they may be applicable to any integrated circuit technology in which bulk connections are provided and in which bulk current during normal operation is negligible or can be distinguished from bulk current induced by SET events.

Referring now to FIG. 1, there is shown a simplified cross-sectional diagram of a stray particle striking a metal-oxide semiconductor field-effect transistor (MOSFET). Transistor 100 is generally a four-terminal device, typically with contacts for a gate G, a drain D, a source S and a bulk region B. Drain D and source S may comprise n-doped or p-doped regions of the well or substrate, depending on the type of device (e.g., PMOS or NMOS) and the process technology in use. As shown in FIG. 1, drain D and source S are n-doped regions (denoted as N+) in a p-doped substrate (denoted as P-sub), resulting in an NMOS device. However, in other cases, drain D and source S may be p-doped regions in an n-doped well or substrate, resulting in a PMOS device.

Likewise, bulk B may be p-doped or n-doped, depending on the type of device.

In practice, a single bulk B may be shared among a plurality of transistors. Likewise, various other contacts may be linked or merged, depending on the particular layout needs and if device geometry permits.

As shown in FIG. 1, when a stray particle 150 strikes a sensitive node (e.g., drain D) of transistor 100 it may create a plurality of electron/hole pairs (denoted in FIG. 1 as '−' and '+' symbols, respectively) and, as a result, a transient current $I_p$ may be generated between drain D and bulk B of transistor 100.

In particular, the SET-induced current pulse can propagate through the bulk region of a transistor. When a stray particle strikes a sensitive node in a CMOS circuit, a transient current can be induced by electron-hole pairs flowing from the output node to the bulk region, as shown in FIG. 1.

In addition, two other transient current paths may exist. For example, there may be a discharge current associated with charge accumulated at a node. There may also exist a current path from VDD through a connected PMOS transistor that is "ON". Each of these transient currents may contribute to the bulk current I, as shown FIG. 1.

In the example shown, the direction of bulk current is considered to flow from the bulk contact.

A similar mechanism may generate a transient current through a PMOS transistor. In this case, the direction of bulk current may be considered as flowing into the bulk contact.

During normal circuit operation, the current flowing between the drain and bulk is typically negligible due to reverse-biasing of the transistor junction. Accordingly, if a current is detected flowing through the bulk, it can be presumed that a SET event has occurred.

Accordingly, current flow may be measured between the drain and bulk contacts of transistor 100. The current flow may also result in a measurable potential difference between drain D and bulk B.

If transistor 100 is a PMOS transistor, a current pulse induced by particle 150 can lead the PMOS transistor's substrate voltage to a potential less than the PMOS bulk rail voltage, VDD. Alternatively, if transistor 100 is an NMOS transistor, the current pulse may lead the NMOS transistor's substrate voltage greater than the NMOS bulk rail voltage, GND. Accordingly, sensors can be tuned to detect strikes in NMOS or PMOS transistors if the deviation below or above the bulk rail voltage exceeds a threshold level.

Figure 2:
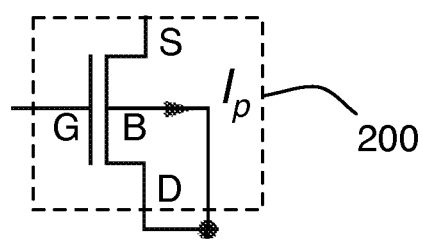
FIG. 2 is a schematic representation of an NMOS transistor.

Referring now to FIG. 2, there is shown a schematic representation of an NMOS transistor 200. NMOS transistor 200 may be an example of transistor 100. The schematic representation illustrates the gate G, drain D, source S and bulk B. In addition, a current $I_p$, induced by a stray particle strike, is shown between bulk B and drain D.

Figure 3:
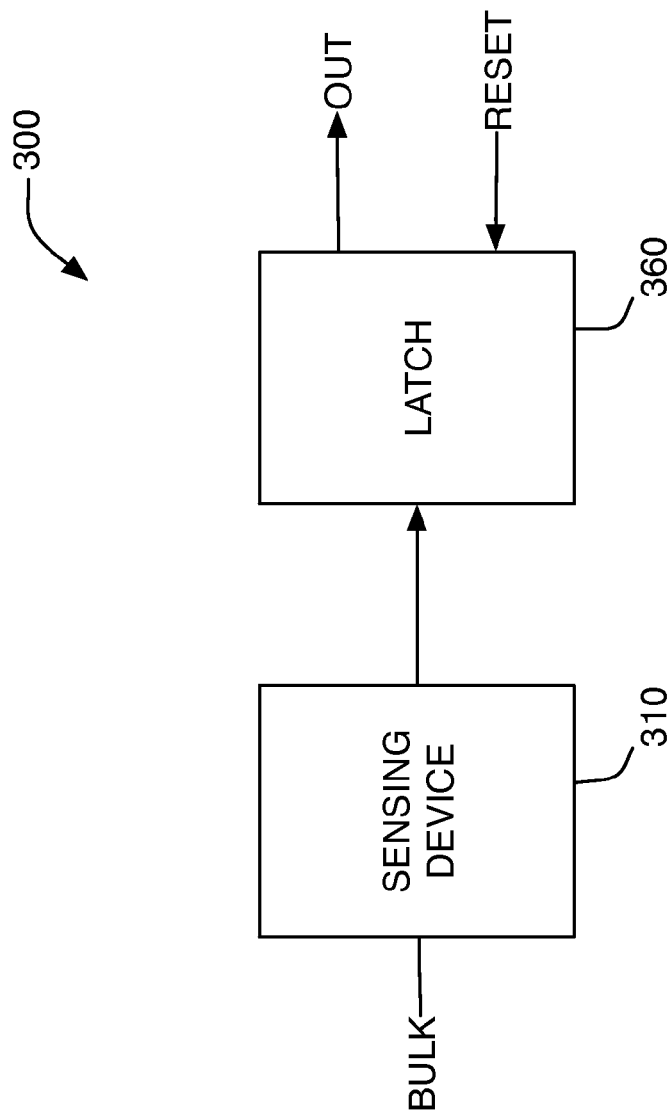
FIG. 3 is a simplified block diagram of an exemplary built-in voltage sensor.

Referring now to FIG. 3, there is shown a simplified block diagram of an exemplary BIVS. In general, BIVS 300 may be a P-BIVS or an N-BIVS, depending on the transistors to be monitored. For example, to monitor PMOS transistors, a P-BIVS may be selected, or vice versa.

BIVS 300 comprises a sensing circuit 310, the input of which is connected to a bulk contact of one or more transistors to be monitored.

The output of sensing circuit 310 is provided to latch 360, which provides an output OUT, and which may be reset to a first, or initial, state using a RESET line.

Figure 4:
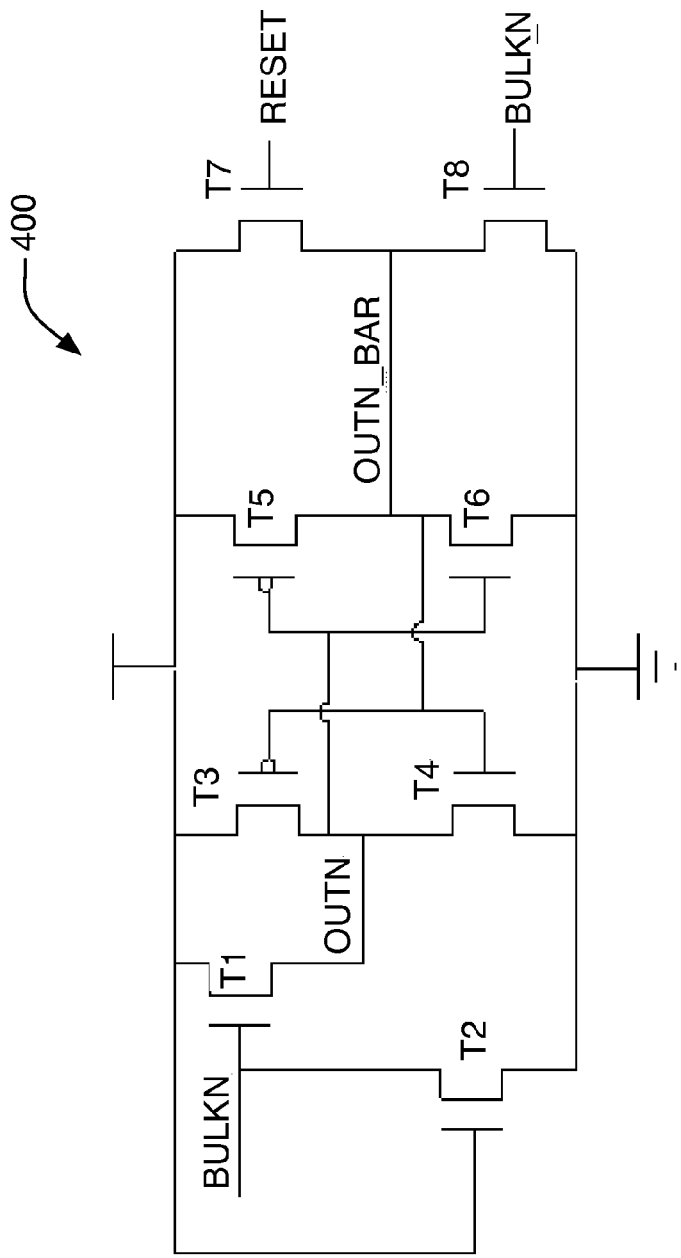
FIG. 4 is an exemplary schematic diagram of a built-in voltage sensor for monitoring NMOS transistors.
Figure 5:
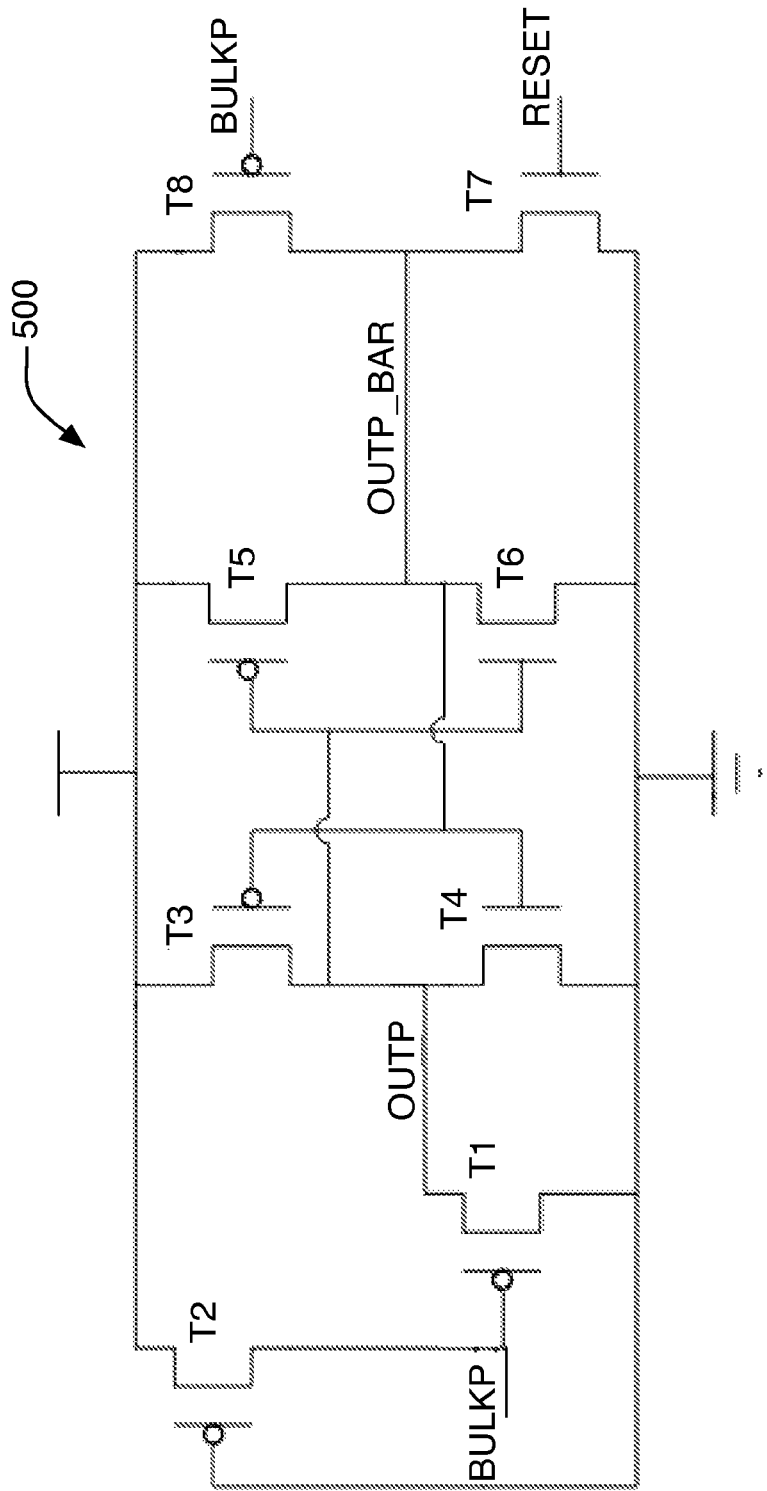
FIG. 5 is an exemplary schematic diagram of a built-in voltage sensor for monitoring PMOS transistors.

Referring now to FIGS. 4 and 5, there are shown exemplary schematic diagrams of built-in voltage sensors for monitoring NMOS and PMOS transistors, respectively.

As described above with reference to FIG. 3, both the N-BIVS and P-BIVS can generally comprise a sensing circuit 310 and a latch 360. The sensing circuit can be formed of a sensing transistor T1 and transistor T2, and followed by an asynchronous latch formed of transistors T3 to T6. Transistors T7 and T8 may be used to set and reset the latch.

Referring now to FIG. 4 in particular, an example N-BIVS 400 is shown. The bulk contacts (e.g., connected to node BULKN) of the NMOS transistors to be monitored can be connected to the gate of transistors T1 and T8. During regular operation (i.e., without any particle strikes), BULKN remains low (e.g., approximately GND) and, accordingly, transistors T1 and T8 remain turned off.

The latch outputs "OUTN" and "OUTN_BAR" can be initialized to GND and VDD respectively by setting the "RESET" node to VDD for a short period. Accordingly, output "OUTN" will remain at logic '0' (e.g., low or GND) until a SET event occurs.

Once a SET event occurs, the bulk potential perturbations (or bulk current) may change the gate voltage of transistors T1 and T8, triggering a flip in the latch state to a second state and causing output OUTN to flip to logic '1' (e.g., high or VDD).

Referring now to FIG. 5 in particular, an example P-BIVS is shown. The P-BIVS has an operating mechanism analogous to the N-BIVS of FIG. 4.

During regular operation (i.e., without any particle strikes), BULKP remains high (e.g., approximately VDD) and, accordingly, transistors T1 and T8 remain turned off.

The latch outputs "OUTP" and "OUTP_BAR" can be initialized to GND and VDD respectively by setting the "RESET" node to VDD for a short period. Accordingly, output "OUTP" will remain at logic '0' (e.g., low or GND) until a SET event occurs.

Once a SET event occurs, the bulk potential perturbations (or bulk current) may change the gate voltage of transistors T1 and T8, triggering a flip in the latch state to a second state and causing output OUTP to flip to logic '1' (e.g., high or VDD).

If desired, a detection module may be used, which can employ digital logic adapted to monitor the latch (and the latches of other SET sensors) and trigger appropriate error correction if at least one latch of the SET sensors is set to the second state. For example, the detection module may be a general purpose microprocessor, a field-programmable gate array (FPGA), an integrated error correction logic circuit, or the like.

Both the exemplary N-BIVS and P-BIVS comprise eight transistors, utilizing minimum area. Likewise, both the N-BIVS and P-BIVS a single reset signal can be used for both N-BIVS and P-BIVS, further reducing the circuit complexity when both sensors are employed.

An example implementation, made using straightforward and non-aggressive layout strategies, of both the N-BIVS and P-BIVS in a common 90 nm CMOS technology resulted in a circuit footprint of 9.1 μm×4.5 μm.

Referring now to FIGS. 6A to 6E, there are shown simulation results for exemplary BIVS circuits.

To verify functionality, a number of simulations using the exemplary BIVS circuits were performed. In one simulation, a CMOS inverter was constructed and the bulk contact of each transistor was connected to the appropriate BIVS (e.g., NMOS transistor bulk contacts connected to N-BIVS). The PMOS transistor width in the inverter was chosen to be 400 nm and the corresponding NMOS transistor width was chosen to be 200 nm.

Double-exponential current pulses of 150 μA, with a pulse width (Tp) of 50 ps were injected between the drain and substrate nodes of the inverter transistors. FIGS. 6A and 6C illustrate the simulated current pulses for BULKP and BULKN, respectively.

The simulations showed that the delay between the simulated current pulse and a corresponding change in BIVS circuit output was approximately 110 ps, as can be seen in FIGS. 6B and 6D.

A single BIVS may be used to monitor a plurality of transistors. For example, one N-BIVS may be used to monitor all of the NMOS transistors in a combinational logic circuit. In such configurations, the bulk contacts (or substrate contacts) of each transistor to be monitored can be tied together and connected to the input of the BIVS. For example, in the N-BIVS of FIG. 4, the bulk contacts may be connected to the gates of transistors T1 and T8.

The larger number of devices can cause an increase in parasitic capacitance at the gate nodes of transistors T1 and T8. Accordingly, the switching threshold and transition time for the BIVS circuit output (e.g., OUTN and OUTN_BAR in FIG. 4) may be increased.

Referring now to FIG. 6E, there is shown the simulated transition time for an exemplary N-BIVS with various numbers of NMOS transistors being monitored.

The N-BIVS was simulated to monitor one transistor, 70 transistors and 150 transistors. It can be seen in FIG. 6E that transition time degraded (i.e., increased) by approximately 350 ps when 150 transistors were monitored.

In addition to inverter tests, a 4-bit multiplier circuit was also used to characterize the ability of the BIVS to detect SETs in combinational logic circuits. During simulations, current pulses with various current amplitude and duration time were injected into the drain and substrate nodes to simulate stray particle strikes. Various current pulse characteristics were used and the simulated BIVS sensors were able to detect all SETs that resulted in a charge deposition of greater than 8 fC.

The same 4-bit multiplier design was fabricated in a common 90-nm CMOS technology with BIVS sensors liberally placed throughout the layout. In this test layout, a bulk contact and a substrate contact were placed inside each logic gate. To measure the effectiveness and sensitivity of the sensors, each BIVS was connected to multiple logic gates.

For example, one BIVS was connected to ten different bulk contacts associated with a group of different logic gates. Accordingly, any particle strike resulting in a SET within the area covered by the group of logic gates could be detected by the single BIVS circuit.

Both N-BIVS and P-BIVS circuits were connected in this manner to monitor 10, 20, 40, 80 and 160 contacts in the multiplier circuit, respectively. To capture SET current pulses that reached the output of the multiplier logic, every output of the multiplier circuit was also connected to an asynchronous latch.

As naturally occurring single-events can be random, a laser can be used to generate single-events. To facilitate testing, the multiplier and BIVS circuits can be arranged to leave the integrated circuit exposed from above (e.g., no dummy metal deposited).

The fabricated multiplier design was tested using a titanium-sapphire laser with a tunable pulse repetition rate. The laser pulse width was set to 1 ps, with a repetition rate of 4.75 MHz. The wavelength of the laser was 800 nm and the laser beam was focused on the surface of the die (1 μm×1 μm spot size) via a microscope. Outputs of the multipliers and the sensors were monitored with an FGPA testing board. SET current pulses were generated by scanning the laser across the exposed circuit.

TABLE 1

| Number of Contacts | Laser Energy Required to Produce Transition (pJ/pulse) | | |
|---|---|---|---|
| | P-BIVS | N-BIVS | Multiplier Output |
| 10 | 15 | 110 | 82 |
| 20 | 25 | 123 | 82 |
| 40 | 42 | 149 | 82 |
| 80 | 75 | No transition | 82 |
| 160 | No transition | No transition | 82 |

Experimental results are displayed in Table 1. The first column displays the number of contacts (bulk or substrate) connected to the sensors. The remaining columns display the minimum laser energy needed to generate a logic transition at the output of the sensor or multiplier.

With 10 transistors being monitored, the P-BIVS was able to detect a SET current pulse induced by a 15 pJ laser pulse. The N-BIVS was able to detect a SET current pulse induced by a 110 pJ laser pulse. An 82 pJ laser pulse was sufficient to generate an output transition in the multiplier circuit.

Even with 80 transistors monitored by a single P-BIVS, the sensor was able to detect a SET-induced current pulse even though the current pulse was not at a high enough energy to produce a transition in the multiplier output (e.g., an error). For example, an 82 pJ pulse was required to produce a transition at the multiplier outputs (error), whereas the P-BIVS was able to detect SETs with laser pulse energies as low as 15 pJ.

When 160 transistors were connected to a single sensor, both the P-BIVS and N-BIVS circuits were unable to detect a current pulse.

In the example testing, P-BIVS circuits appeared more sensitive to SET induced current pulses than N-BIVS circuits (e.g., higher laser energies were required to detect transitions in the N-BIVS). This result was expected because voltage perturbations in the substrate are typically smaller than those within an n-well for the CMOS technology that was used to fabricate the multiplier circuit. However, depending on the specific process technology used for fabrication, one or the other of the P-BIVS and N-BIVS may exhibit superior performance.

Accordingly, given a suitable number of BIVS circuits, it may be possible to detect all SETs within a monitored area of the integrated circuit. In particular, grid formation of sensors may be employed, and can be addressed suitably (e.g., as in a memory array) to identify the specific location of a SET within the grid. Accordingly, designers of complex sequential circuits, such as microprocessors, can determine the location of a SET and generate an appropriate response to mitigate the effects of the hit. For example, when a SET is detected at a location in the grid, the computation performed at that grid location may be re-executed to ensure a correct result.

As described, a single BIVS may be able to detect SETs in approximately 100 monitored transistors. However, it may be desirable to improve detection sensitivity in some cases.

In particular, in some cases, the voltage variation at a bulk contact that is associated with a SET may be minimal (e.g., 50 mV). However, while the voltage variation may be small, there may still be a relatively large amount of current flow. Thus, the SET can also be detected by detecting the injected current converted it to voltage.

Accordingly, in some embodiments, the described BIVS may be modified to produce a built-in current sensor (BICS), which can exploit advantageous properties of current detection as opposed to voltage detection.

Figure 7:
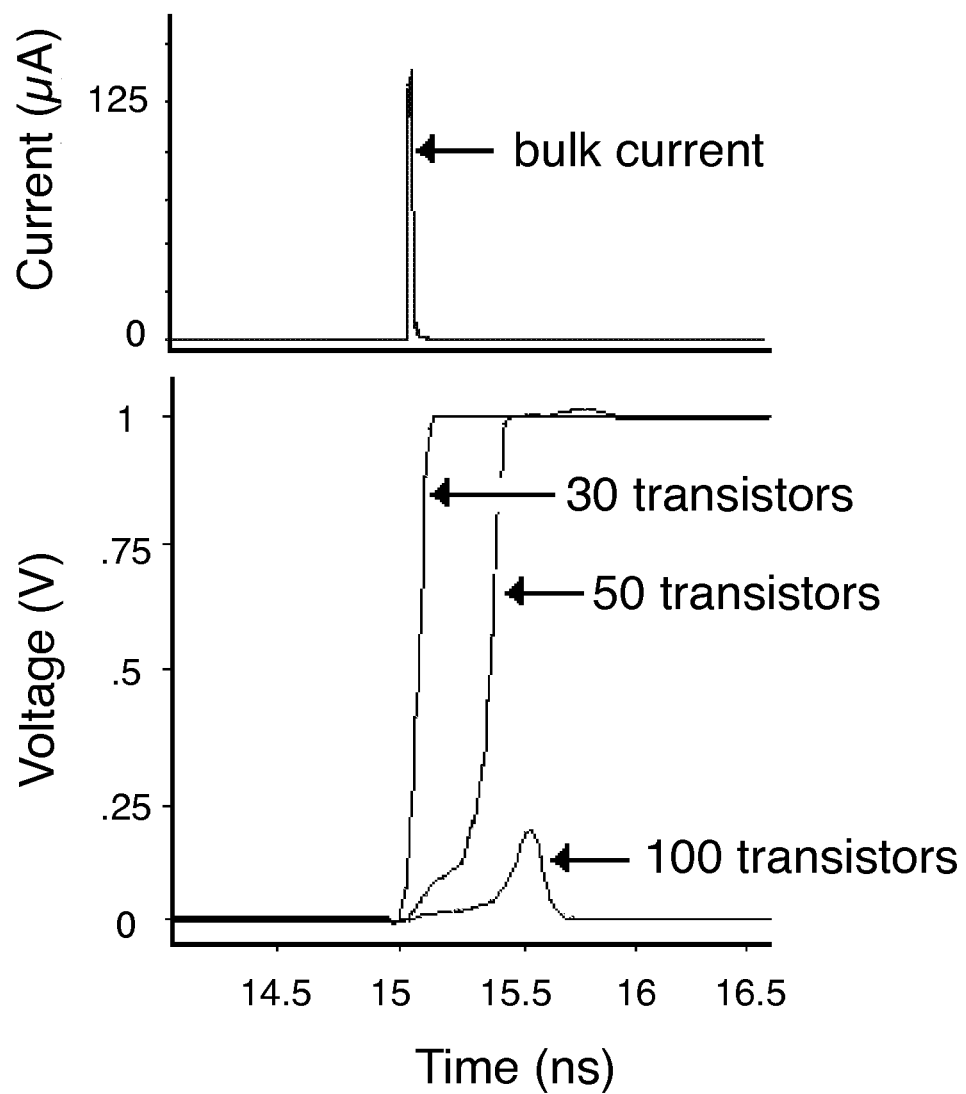
FIG. 7 is an exemplary diagram illustrating the impact on SET detection associated with connecting additional transistors to a sensing circuit.

Referring now to FIG. 7, there is shown an exemplary diagram illustrating the impact on SET detection associated with connecting additional transistors to a sensing circuit. The results shown in FIG. 7 were generated experimentally using a test circuit fabricated in a common 90 nm CMOS technology.

While the bulk current perturbations caused by a SET event are largely independent of the number of transistors monitored by a sensing circuit, in a BIVS circuit, the number of transistors that can be monitored by a BIVS may be limited by the size of transistor T2.

For example, in the N-BIVS of FIG. 4, all of the NMOS transistor bulk contacts in the circuit being monitored are connected to ground through transistor T2. More particularly, since the gate of transistor T2 is connected to VDD, meaning transistor T2 is always 'ON', the bulk contacts of each NMOS transistor being monitored are effectively tied to ground via transistor T2.

After a positive reset pulse, the latch is in a stable state, where the output voltage OUTN is low (e.g., logic '0'). When a SET event occurs in the monitored circuit, the resulting bulk current can charge the equivalent capacitance at the gate of sensing transistor T1 and the drain of transistor T2 (i.e., node BULKN). Once this voltage is beyond the threshold voltage of transistor T1, the logic state of the latch can be reversed. A similar detection mechanism (e.g., P-BIVS) can be used for PMOS transistors.

The size of transistor T2 may effectively limit the number of transistors that can be monitored. In particular, to ensure normal operation of the monitored circuit (e.g., by maintaining reverse-biasing of the transistor pn-junctions), the size of the transistor T2 should be sufficiently large to ensure that node BULKN is effectively tied to ground. If transistor T2 is sized too small for the number of connected transistors, BULKN may float and therefore impair normal operation of the monitored circuit.

However, at relatively large sizes of transistor T2, the voltage increase associated with a SET-induced current pulse may not be sufficient to flip the latch. This effect can be seen in FIG. 7, where as the number of transistors being monitored increases, the voltage at the input of the BIVS associated with a SET event is decreased. Accordingly, with an increase in the number of transistors being monitored, it becomes more difficult to detect a SET event.

Additional simulations were carried out using a transient current exponential pulse with a ±200 μA magnitude, a 100 ps rise time and a 550 ps fall time. The simulation results, for a device fabricated in a common 90 nm CMOS technology, demonstrated that a transistor T2 of size 0.2 μm could support monitoring of up to 100 NMOS transistors or 50 PMOS transistors (depending on the selected BIVS type). This correlated to an area overhead of approximately 20 to 30 percent for implementing BIVS detection. Accordingly, applying a BIVS approach to produce radiation tolerant microprocessors may require a non-trivial amount of circuit area.

Figure 8:
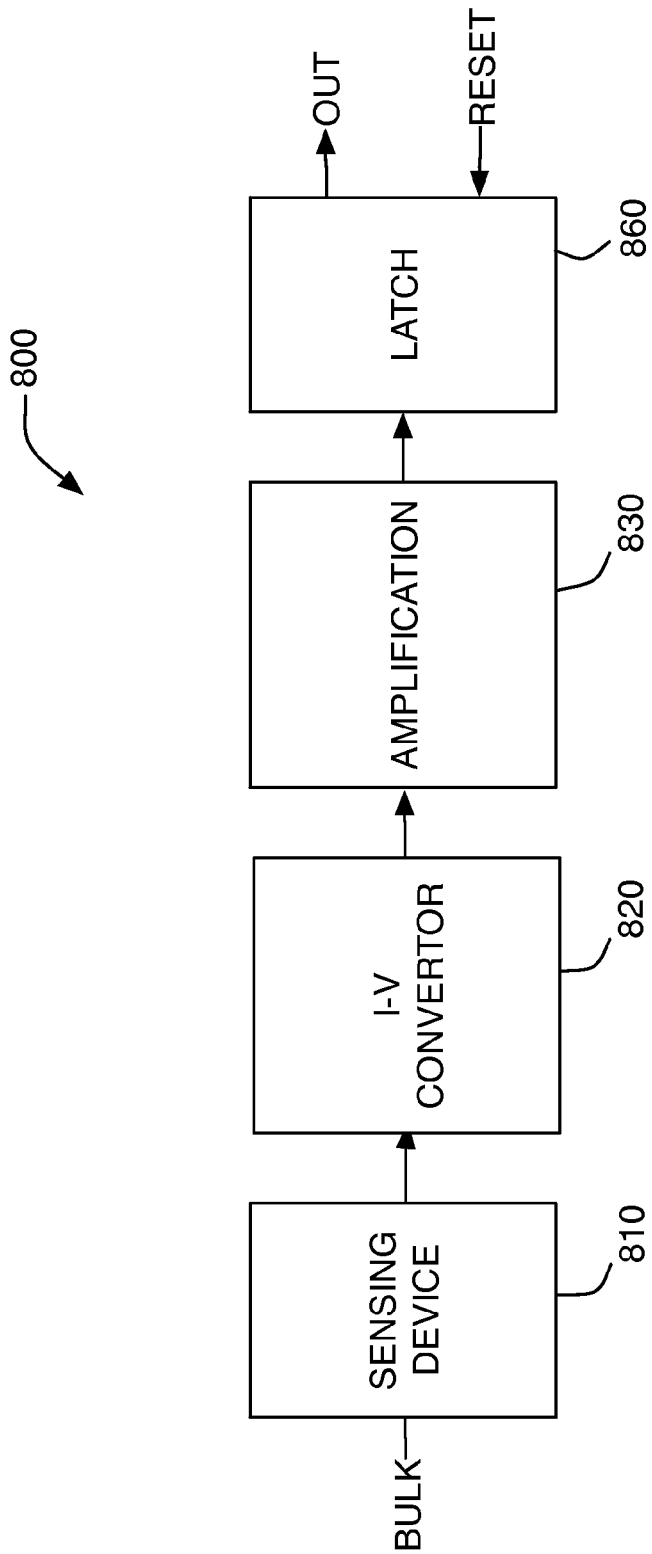
FIG. 8 is a simplified block diagram of an exemplary built-in current sensor.

Referring now to FIG. 8, there is shown a simplified block diagram of an exemplary BICS. In general, BICS 800 may be a P-BIOS or an N-BICS, depending on the transistors to be monitored. For example, to monitor PMOS transistors, a P-BIOS may be selected, or vice versa.

BICS 800 comprises a sensing circuit 810, the input of which is connected to a bulk contact of one or more transistors to be monitored.

The output of sensing circuit 810 is provided to a current-to-voltage converter 820. The output of converter 820, which may be a differential voltage signal, can be amplified by one or more amplification stages 830, if necessary to improve signal strength. Finally, the voltage signal can be input to latch 860, which provides an output OUT, and which may be reset to an initial state using a RESET line.

Figure 9:
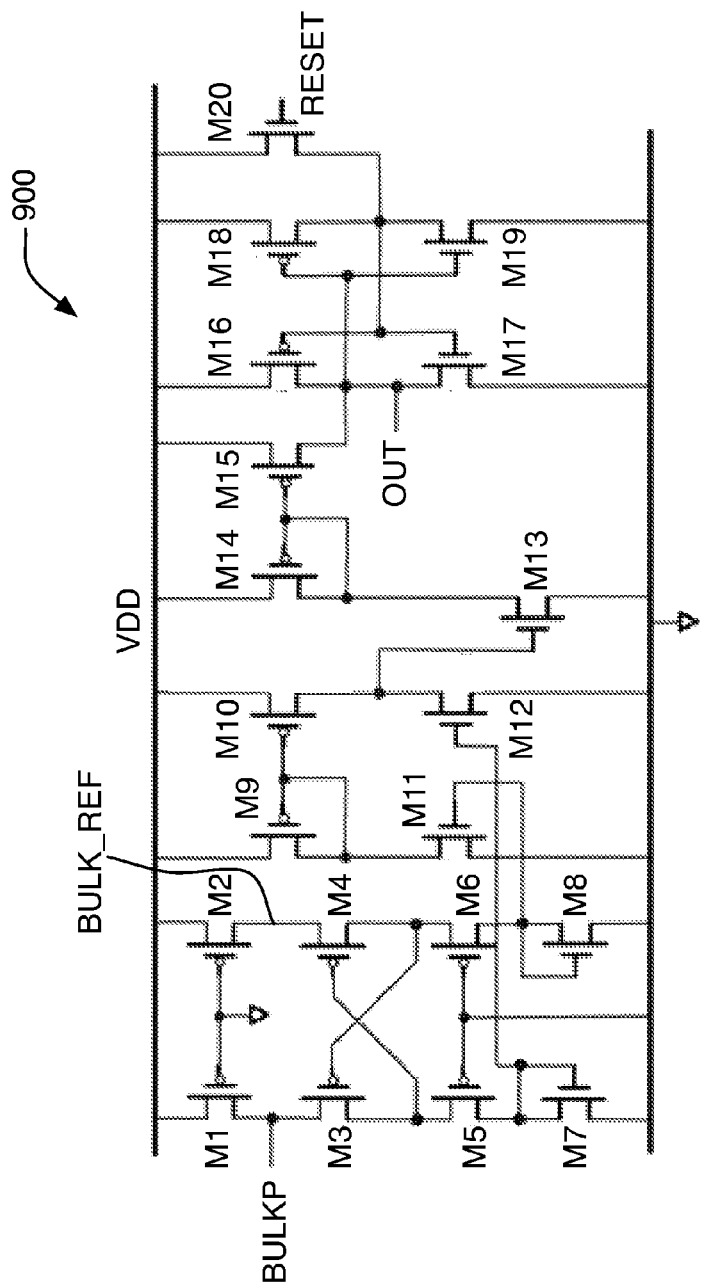
FIG. 9 is an exemplary schematic diagram of a built-in current sensor for monitoring PMOS transistors.
Figure 10:
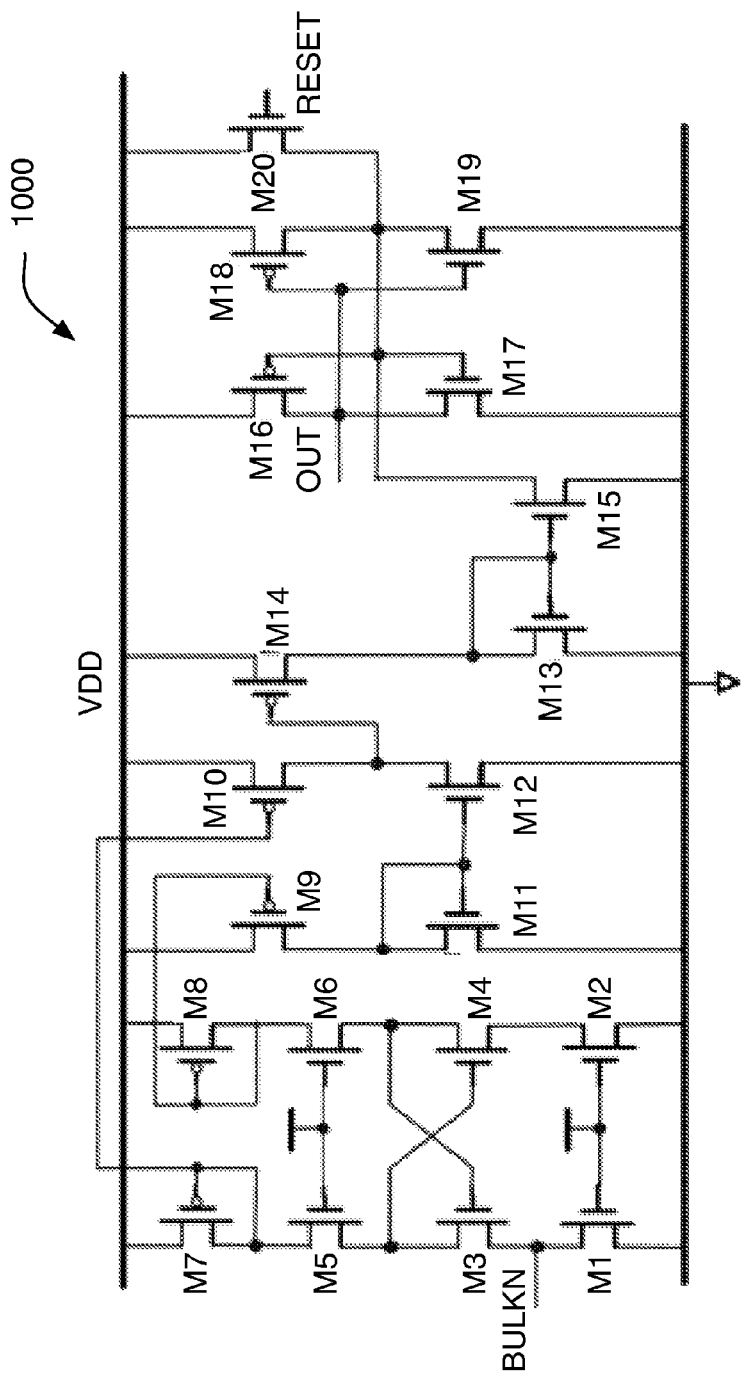
FIG. 10 is an exemplary schematic diagram of a built-in current sensor for monitoring NMOS transistors.

Referring now to FIGS. 9 and 10, there are shown exemplary schematic diagrams of built-in current sensors for monitoring PMOS and NMOS transistors, respectively.

As described above with reference to FIG. 8, both the N-BIOS and P-BIOS can generally comprise a sensing circuit, a current-to-voltage converter, one or more amplification stages and a latch.

Referring now to FIG. 9 in particular, a P-BICS is shown. The sensing circuit can be formed of two sensing transistors M1 and M2. The drain of M1 can be connected to the bulk contacts of the PMOS transistors to be monitored. Similar to the P-BIVS, the bulk potential of the PMOS transistors to be monitored can be set to VDD through transistor M1. A transistor M2 can be added to obtain a symmetrical potential between node BULKP and BULK_REF (i.e., at the drain of M2).

In some cases, the current-to-voltage converter can be selected to exhibit a high output impedance. In other cases, this is not necessary. Accordingly, the current-to-voltage converter may comprise a current conveyor circuit, such as the current conveyor formed by transistors M3, M4, M5 and M6. Transistors M7 and M8 may be used to provide a load for the current conveyor. The current-to-voltage converter can help to overcome a large capacitance at node BULKP, such as may be associated with the bulk contacts of a large number of transistors to be monitored.

One or more amplification stages may be used. For example, a first amplification stage comprised of transistors M9 to M12 forms a differential voltage amplifier (the differential voltage being provided by the corresponding outputs of the current conveyor (e.g., the drains of transistors M5 and M6).

A second amplification stage may be comprised of transistors M13 and M14 forming a common-source amplifier. Various amplification stage combinations may be employed. In some other cases, only a single stage amplifier may be used, for example comprising a larger differential voltage amplifier. Use of the amplification stages enables detection sensitivity to be increased significantly.

The latch may be comprised of transistors M16 to M20. Once the BICS is powered on, a pulsed reset signal can be used to set the latch state to a known logic level.

As with the BIVS approach, the output of the BICS, at node 'OUT', can be low (e.g., logic '0') when in the initial, reset state. If a bulk current is detected, the latch output can flip to a new state (e.g., logic '1').

Referring now to FIG. 10 in particular, an N-BICS is shown. N-BICS is generally analogous to the P-BICS of FIG. 9.

Figure 11:
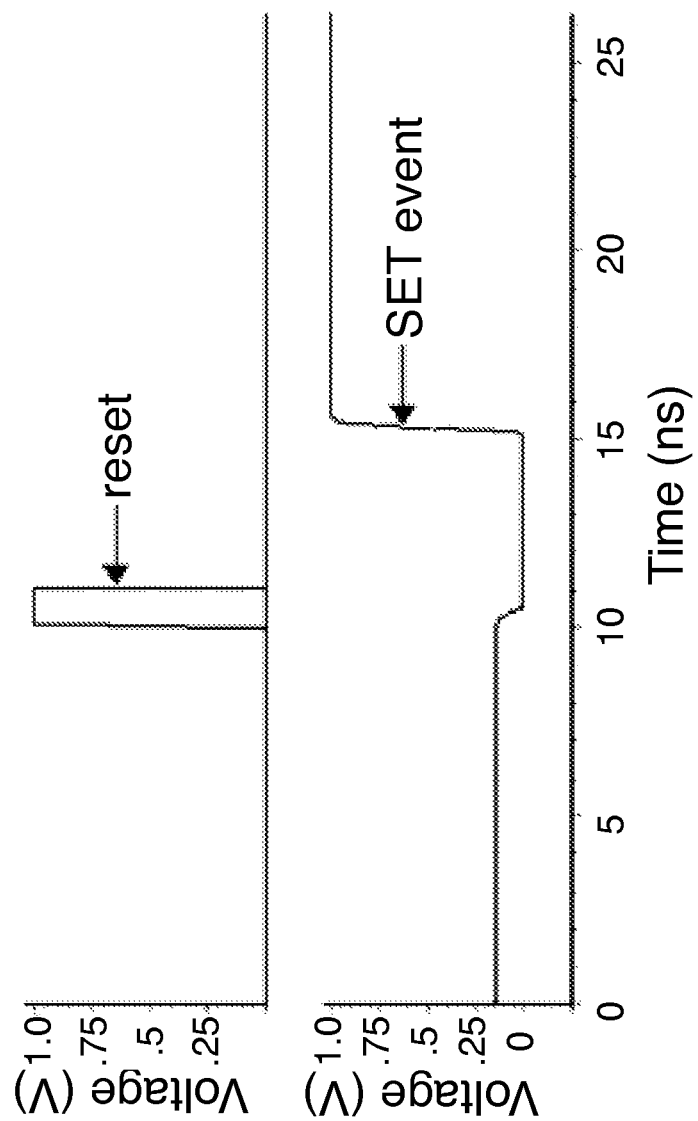
FIGS. 11 and 12 illustrate simulation results for exemplary BICS circuits.
Figure 12:
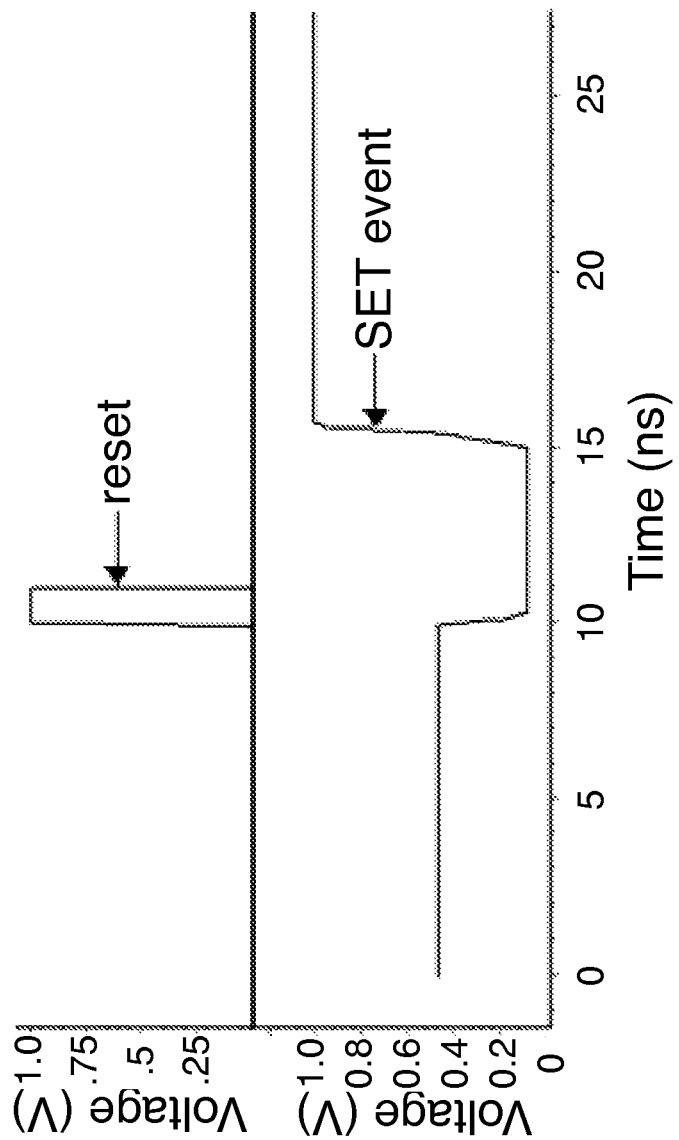

Referring now to FIGS. 11 and 12, there are shown simulation results for exemplary BICS circuits.

To verify functionality, a number of simulations using the exemplary BICS were performed. In one simulation, a CMOS inverter was constructed and the bulk contact of each transistor was connected to the appropriate BICS (e.g., NMOS bulk connected to N-BICS). In another simulation, a 4-bit multiplier was used to exemplify the ability of the BICS approach to detect SETs in a combinational logic circuit. The test circuits were implemented in a common 90 nm CMOS technology. For this technology, supply VDD is 1 V, and the threshold voltages of NMOS and PMOS transistors are approximately 0.3 V for standard transistors.

The test inverter was sized with minimal dimensions to represent a typical logic circuit. PMOS transistor length was chosen to be 100 nm, with a transistor channel width of 400 nm. NMOS transistor channel width was chosen to be 200 nm.

A set of transient current pulses with different current peaks and constant time were injected to sensitive nodes of the simulated circuit. The BICS circuits were capable of detecting current pulses of approximately 100 µA with a pulse width (Tp) of approximately 50 ps.

With transistors M1 and M2 sized at 1 µm, simulation results indicate that more than 2,000 transistors can be monitored with a single BICS.

FIG. 11 illustrates a reset signal being applied to an N-BICS at time t=10 ns and a test SET current pulse occurring at time t=15 ns. Likewise, FIG. 12 illustrates a similar test for a P-BICS.

It can be seen that the BICS output changes quickly following the current pulse at time t=10 ns.

In another simulation, a 4-bit multiplier design was chosen as a test vehicle, as a multiplier is a common combinational logic circuit.

The bulk contacts of each of the NMOS transistors in the multiplier were connected to a single N-BICS. Similarly, the bulk contacts of each of the PMOS transistors in the multiplier were connected to a single P-BICS.

The circuit area occupied by the test N-BICS and P-BICS circuits was 80 µm² and 60 µm², respectively.

A set of current pulses simulating SET events were injected into sensitive nodes. The simulation results confirmed that a single N-BICS or P-BICS circuit can detect SET events in the 4-bit multiplier.

In contrast, three N-BIVS and five P-BIVS were required to monitor all transistors in a similar multiplier.

It can be seen that these simulation results differ from the experimental results described herein, which indicate that P-type sensors can be more sensitive than N-type sensors in actual operation. This may be due to process-specific issues. In particular, in certain advanced CMOS process technologies, it can be easy for n-well voltage to collapse. The result is that an N-type sensor may exhibit reduced sensitivity in such CMOS technologies.

The use of both N-BICS and P-BICS may be redundant in some combinational logic circuits. Accordingly, in some cases, it may be desirable to forego using complementary BICS circuits. In such cases, a single P-BICS or N-BICS may be used to monitor a logic circuit independently.

The described SET sensors (e.g., BIVS and BICS circuits) combine high sensitivity of detection with efficient characteristics. In particular, the described BIVS and BICS circuits use few transistors, requiring minimal space, and significantly reduce or eliminate the static power draw associated with previous techniques. Accordingly, the described circuits are capable of efficiently monitoring large numbers of transistors.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments.

Further, while the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto.

We claim:

1. A sensor for detecting a single-event transient (SET) in an integrated circuit comprising at least one transistor, the sensor comprising:
a sensing circuit, the sensing circuit connected between a bulk rail of the integrated circuit and a bulk contact of the at least one transistor such that in operation a bulk contact voltage is supplied by the bulk rail, the sensing circuit configured to provide a sensing output when an increase in a bulk current supplied to the at least one transistor is detected; and
a latch, the latch configured to flip from a first state to a second state based on the sensing output.

2. The sensor of claim 1, wherein the change in operating condition is a deviation in the bulk contact voltage from a bulk rail voltage beyond a threshold level.

3. The sensor of claim 1, wherein the sensing circuit comprises at least one sensing transistor, and wherein the bulk contact is connected to a gate of the at least one sensing transistor.

4. The sensor of claim 3, wherein a source of the at least one sensing transistor is connected to the bulk rail.

5. The sensor of claim 1, further comprising a current-to-voltage converter connected to the sensing circuit, the current-to-voltage converter for generating a voltage output based on the increase in the bulk current.

6. The sensor of claim 5, wherein the current-to-voltage converter is a current conveyor.

7. The sensor of claim 5, further comprising at least one amplification stage for amplifying the voltage output of the current-to-voltage converter, wherein an amplified output of the at least one amplification stage, corresponding to the voltage output of the current-to-voltage converter, is input to the latch.

8. The sensor of claim 7, wherein the at least one amplification stage comprises a differential amplifier.

9. The sensor of claim 7, wherein the at least one amplification stage comprises a common-source amplifier.

10. The sensor of claim 7, wherein the at least one amplification stage comprises a first stage and a second stage.

11. The sensor of claim 10, wherein the first stage is a differential amplifier and the second stage is a common-source amplifier.

12. The sensor of claim 1, wherein the at least one transistor is one or more PMOS transistors.

13. The sensor of claim 1, wherein the at least one transistor is one or more NMOS transistors.

14. The sensor of claim 1, wherein the latch is configured to be reset to the first state by a reset signal.

15. The sensor of claim 1, wherein the integrated circuit is a CMOS circuit.

16. A method of detecting a single-event transient (SET) in an integrated circuit comprising at least one transistor, the method comprising:
connecting a bulk rail of the integrated circuit and a bulk contact of the at least one transistor via a sensing circuit, such that in operation a bulk contact voltage is supplied by the bulk rail;
monitoring a bulk contact using the sensing circuit to detect an increase in a bulk current supplied to the at least one transistor; and
providing a sensing output based on the detected increase in the bulk current.

17. The method of claim 16, wherein the change in operating condition is a deviation in the bulk contact voltage from a bulk rail voltage beyond a threshold level.

18. A CMOS integrated circuit comprising a single-event transient (SET) detector, the circuit comprising:
a plurality of PMOS and NMOS transistors;
at least one SET sensor, each SET sensor connected to a subset of PMOS transistors or a subset of NMOS transistors in the plurality of PMOS and NMOS transistors, each SET sensor comprising:
a sensing circuit, the sensing circuit connected between a bulk rail of the integrated circuit and a corresponding bulk contact of the at least one transistor such that in operation a bulk contact voltage is supplied by the bulk rail, the sensing circuit configured detect a change in operating condition and provide a sensing output;
a latch, the latch configured to flip from a first state to a second state based on the sensing output; and
a detection module, the detection module adapted to monitor the latch of each of the SET sensors and trigger error correction if at least one latch of the SET sensors is set to the second state.

19. The integrated circuit of claim 18, wherein the change in operating condition is an increase in a bulk current supplied to the at least one transistor.

* * * * *

UNITED STATES PATENT AND TRADEMARK OFFICE
CERTIFICATE OF CORRECTION

PATENT NO. : 8,451,028 B2  
APPLICATION NO. : 13/069102  
DATED : May 28, 2013  
INVENTOR(S) : Li Chen et al.

Page 1 of 1

It is certified that error appears in the above-identified patent and that said Letters Patent is hereby corrected as shown below:

In the Specification:

Col. 9, Line 6, delete "P-BIOS" and insert -- P-BICS --.

Col. 9, Line 8, delete "P-BIOS" and insert -- P-BICS --.

Col. 9, Line 23, delete "N-BIOS and P-BIOS" and insert -- N-BICS and P-BICS --.

Signed and Sealed this  
Fifteenth Day of October, 2013

Teresa Stanek Rea  
*Deputy Director of the United States Patent and Trademark Office*